United States Patent [19]

Reichler et al.

[11] Patent Number: 5,729,211
[45] Date of Patent: Mar. 17, 1998

[54] ASSEMBLY FOR TRANSFERRING DATA

[75] Inventors: Edmund Reichler; Karl Hochreuther, both of Nürnberg; Uwe Spiess, Amberg; Erhard Lang, Schmidgaden; Reinhard Staudte, Hirschau, all of Germany

[73] Assignee: Gossen Metrawatt GmbH, Nuermberg, Germany

[21] Appl. No.: 618,112

[22] Filed: Mar. 19, 1996

Related U.S. Application Data

[63] Continuation of Ser. No. 874,534, Apr. 27, 1992, abandoned.

[30] Foreign Application Priority Data

| Apr. 25, 1991 | [DE] | Germany | 91 05 087 U |
| Jul. 6, 1991 | [DE] | Germany | 91 08 362 U |
| Mar. 31, 1992 | [DE] | Germany | 42 10 526.9 |

[51] Int. Cl.⁶ ............................ G08C 17/00
[52] U.S. Cl. .................. 340/870.28; 364/708.1; 324/156; 361/728
[58] Field of Search ............ 340/870.28, 870.29, 340/870.3, 310.08; 359/143, 159; 364/705.01, 705.05, 708.1, 709.01, 709.09, 709.1; 73/431, 866.5; 324/156; 250/239, 491.1; 361/679, 686, 727, 728, 807; 174/52.1, 58, 59, 61, 62

[56] References Cited

U.S. PATENT DOCUMENTS

| 4,379,336 | 4/1983 | Yamamoto et al. | 364/708 |
| 4,727,368 | 2/1988 | Larson et al. | 340/825.31 |
| 4,766,746 | 8/1988 | Henderson et al. | 340/825.31 |
| 4,806,906 | 2/1989 | Oda et al. | 364/709.01 |
| 4,868,893 | 9/1989 | Hammond | 340/870.28 |
| 4,941,841 | 7/1990 | Darden et al. | 364/708 |
| 5,123,064 | 6/1992 | Hacker et al. | 364/709.11 |
| 5,161,169 | 11/1992 | Galano et al. | 364/708 |
| 5,175,671 | 12/1992 | Sasaki | 364/708 |
| 5,182,698 | 1/1993 | Kobayashi et al. | 364/708 |
| 5,243,338 | 9/1993 | Brennan, Jr. et al. | 340/870.02 |

*Primary Examiner*—Jeffery Hofsass
*Assistant Examiner*—Andrew Hill
*Attorney, Agent, or Firm*—Herbert L. Lerner; Laurence A. Greenberg

[57] ABSTRACT

An assembly for transferring data comprises a measurement data acquisition unit in the form of a portable measuring device, a measurement data processing unit, and an auxiliary unit for transferring data between the acquisition unit and the processing unit. Contact-less coupling elements are operatively associated with the acquisition and auxiliary units respectively for transferring measurement data between the acquisition unit and the auxiliary unit by contact-less coupling. Data are transferred between the auxiliary unit and the processing unit. The auxiliary unit includes a connecting member for mechanically detachably connecting the auxiliary unit with the acquisition unit such that the contact-less coupling elements face one another at a predetermined spacing and such that the connected acquisition and auxiliary units together form a portable measuring device.

11 Claims, 3 Drawing Sheets

ASSEMBLY FOR TRANSFERRING DATA

This application is continuation of application Ser. No. 07/874,534, filed Apr. 27, 1992, abandoned.

The invention relates to an assembly for transferring data between a measurement data acquisition unit in the form of a portable measuring device and a measurement data processing unit.

In the field of measurement technology it is often required to perform series of measurements in which the gathered measurement values must be further processed or logged. Depending on the requirements, the further processing of the measurement data is done with the aid of a computer and the logging of the measurement data is printed out on a printer, which is directly connected to either the measurement acquisition unit or to the computer.

For the purpose of transferring data from one functional unit to another it is conventional to use connecting lines. This, however, is problematic when the functional units are connected to substantially different potentials. While the computer and, usually, also the printer are operated on mains voltage, the measurement acquisition unit, for instance a multimeter or a testing device, may be a mains-independent battery-operated device which, very often, is subjected to very high potentials through its measurement circuit. A galvanic separation between the measurement acquisition unit and the measurement data processing unit would solve a number of problems and the reducible air gaps and leakage paths would allow for smaller units.

A further problem is found in the fact that for adapting a digitally operating measurement value acquisition unit to a computer, the former must be equipped with an interface. Such an interface, however, is utilized only temporarily and during times when the sporadic measurements do not cause data transmission they constitute superfluous ballast.

It is accordingly an object of the invention to provide an assembly for transferring data, which overcomes the hereinafore-mentioned disadvantages of the heretofore-known devices of this general type and which makes it possible to quickly and without problems adapt the measurement data acquisition unit for data transfer to a measurement data processing device.

With the foregoing and other objects in view there is provided, in accordance with the invention, an assembly for transferring data, comprising a measurement data acquisition unit in the form of a portable measuring device, a measurement data processing unit, and an auxiliary unit for transferring data between the acquisition unit and the processing unit, contact-less coupling elements operatively associated with the acquisition and auxiliary units respectively for transferring data between the acquisition unit and the auxiliary unit by contact-less coupling, and means for transferring data between the auxiliary unit and the processing unit, the auxiliary unit including a connecting member for mechanically detachably connecting the auxiliary unit with the acquisition unit such that the contact-less coupling elements face one another at a predetermined spacing and such that the connected acquisition and auxiliary units together form a portable measuring device.

By means of an auxiliary unit which acts as an interface and which is separable from the measurement acquisition unit and which has a connecting part for a mechanical connection therewith, it is possible to create a, still mobile and portable, connected unit which is usable as a portable measuring device. The transfer of measurement data is effected by means of contactless coupling elements of which at least one is associated with the auxiliary unit and at least another one is associated with the measurement acquisition unit. This does not only automatically provide a galvanic separation, but the measurement acquisition unit can also be connected with and then disconnected from the auxiliary unit without problems and without contact difficulties. The measurement acquisition unit, i.e. a multimeter, for example, must only be equipped with the coupling elements necessary for the data exchange and can then be put into operation selectively with the measurement data processing unit or entirely independently therefrom.

In accordance with another feature of the invention, the measurement data processing unit is a printer or a computer with an optionally connected printer.

In accordance with a further feature of the invention, the measurement data acquisition device is a hand-held multimeter or a hand-held testing device.

In accordance with an added feature of the invention, the contact-less coupling elements are either inductive or capacitive coupling elements and in accordance with an additional feature of the invention, the contact-less coupling elements are opto-electric coupling elements.

In accordance with again another feature of the invention, the opto-electric coupling elements operate in a predetermined wavelength range, preferably the infrared range, and include at least one phototransmitter and at least one photoreceiver, one of the phototransmitter and photoreceiver being associated with the acquisition unit and the other one with the auxiliary unit. Also, the coupling elements may be provided to allow for bidirectional data flow between the acquisition and auxiliary units. Electrically effective, i.e. inductive or capacitive, coupling elements or opto-electric coupling elements are suitable for the coupling between the measurement acquisition unit and the auxiliary unit. The opto-electric coupling elements possess a number of advantages, especially in the infrared operating range. When the measurement acquisition unit is equipped with a phototransmitter, for instance a light-emitting diode, and when the auxiliary unit is equipped with a photoreceiver, for instance a light diode, then data flow in one direction is guaranteed. A further pair of phototransmitter and receiver in the reverse direction is necessary in order to allow the transfer of data from the computer to the measuring device.

In accordance with again a further feature of the invention, the auxiliary unit includes a housing, wherein the connecting member is in the form of an adapter base formed onto the housing, guide and notch elements formed in the adapter base, and wherein the acquisition unit includes deformations in a surface thereof proportionally corresponding to the guide and notch elements for retaining the acquisition unit in the adapter base.

In accordance with again an added feature of the invention, the deformations on the acquisition unit are in the form of indentations and protrusions for engaging in the guide and notch elements of the auxiliary unit, such that an operating surface of the acquisition unit remains freely accessible when the auxiliary and acquisition units are connected.

The configuration of the auxiliary unit is of essential importance for advantageous handling of the device according to the invention. In this respect it is provided that an adapter base is formed onto the housing of the auxiliary unit which acts as a connecting part and which includes guide and notched elements which correspond to recesses and/or protrusions on the measurement acquisition unit. The adapter base thereby must receive the measurement unit in such a way that its operating surface is freely accessible. This is possible when the housing of the auxiliary unit connects to a face surface of the measurement acquisition unit which is free of operating elements or on its bottom.

In accordance with again an additional feature of the invention, the acqustion unit has a lateral end surface, and the housing of the auxiliary unit connects adjacent the lateral end surface.

In accordance with yet another feature of the invention, the acquisition unit has an acquisition unit housing with a contour and a groove formed therein extending parallel to a bottom of the housing and wherein the adapter base is adapted to the contour, the adapter base including side walls and a bottom wall forming a clamp-like U-shell, the adapter base further including mutually facing guide rails formed onto free ends of the side walls for slidably engaging in the groove formed in the acquisition unit housing.

In accordance with yet a further feature of the invention, the acquisition unit has a housing with a bottom and the deformations are cam-like feet integrally formed on the bottom, and wherein the guide and notch elements are indentations in the form of glide grooves and notch troughs formed in the adapter base for receiving the cam-like feet and for mechanically retaining the acquisition and auxiliary units in a locked position.

In accordance with yet an added feature of the invention, the auxiliary unit housing is formed of upper and lower shell-shaped housing parts, the connecting member is in the form of an adapter base integrally formed on the lower housing part for allowing the acquisition unit to be slidably inserted in the auxiliary unit such that a side wall of the acquisition unit located forward in a direction of insertion is positioned immediately adjacent and parallel to a side wall of the housing of the auxiliary unit.

In accordance with yet an additional feature of the invention, the acquisition and auxiliary units each include a housing with respective side walls which, upon connection of the units, abut one another, and wherein the coupling elements are respectively disposed immediately behind the abutting side walls.

In accordance with still a further feature of the invention, at least one of the side walls has a window formed therein for enabling optical transmission between the opto-electric coupling elements.

In accordance with an additional feature of the invention, at least a part, namely the region of the window, or the entire housing of the acquisition unit is formed of infrared translucent material.

In accordance with an added feature of the invention, the device includes a ledge formed on the upper housing part of the auxiliary unit for engaing into the groove of the data acquisition unit when the acquisition and auxiliary units are connected.

In accordance with yet an additional feature of the invention, the housing of the acquisition unit is formed of upper and lower housing parts and the groove for engagement with the guide rails and the ledge is defined by a parting line between the housing parts.

In accordance with a concomitant feature of the invention, the device includes connecting means for electrically connecting the auxiliary unit to the processing unit. A useful shape of the adapter base is attained when it adapts to the outer contour of the measurement acquisition unit and embraces the same in a clamp-type U-shape. A secure connection between the two functional units is assured in that inwardly pointing guide rails are formed onto side walls of the adapter base which form the U, which guide rails engage into a groove which extends parallel to the base of the measurement acquisition unit. It is thus possible to slide the measurement data acquisition unit into the adapter base, which can be in the shape of a shell which is closed on one side and which, however, must be open on the opposite side for the insertion operation. In order for the two functional units to become separated accidentally, the inside of the adapter base is provided with deformations which catch and rest in corresponding deformations on the outside of the measurement data acquisition unit.

The cam-like feet of the measuring device are used as its deformations, which feet are integrally formed on the housing and which, when the two components are connected, slide across slide grooves into catch indentations located on the inside of the adapter base as corresponding deformations.

The housing of the auxiliary unit is suitably formed of two shell-shaped housing parts, of which the lower housing part is integrated in the adapter base. When the measurement data acquisition unit is inserted, its forward side wall in the direction of insertion abuts with a side wall of the auxiliary unit housing in such a way that they abut immediately adjacent one another. Since this position is secured by catch means, this results in an exact relative positioning of the coupling elements disposed behind the two side walls.

When opto-electric coupling elements are used, it must be assured that the dampening of the light beams in the region of the transmission path does not raise above an acceptable value. This can be countered in that windows are disposed in the corresponding housing walls which, in the case of the auxiliary unit, may be realized by way of a simple hole, while the housing of the measurement data acquisition unit may be provided with a recess which decreases the wall thickness of the housing, as long as the housing is formed of a sufficiently translucent material. It is thus necessary to form at least the window of a suitable material, and preferably the entire housing, of a translucent material which is particularly translucent for infrared radiation.

Increased stability of the connection between the auxiliary unit and the measurement data acquisition unit may be attained by a ledge disposed at the upper housing part of the auxiliary unit and facing toward the inside of the adapter base, which ledge engages in a groove of the measurement data acquisition unit similar to the guide rails. It is very useful that that groove, and also the groove needed for the guide rails, need not be especially formed on the measurement data acquisition unit, but that the separation seam which is present between the two housing parts of the measuring device housing serves this purpose.

For the purpose of data transfer between the auxiliary unit and the measurement data processing unit, it is sufficient to provide proper plug-connectors and to connect them through a connector cable.

An exemplary embodiment of the invention will be described in detail in the following and it is illustrated in the drawings. Shown are:

Other features which are considered as characteristic for the invention are set forth in the appended claims.

Although the invention is illustrated and described herein as embodied in a TITLE, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

DESCRIPTION OF THE PREFERRED EMBODIMENTS

Figure 1:
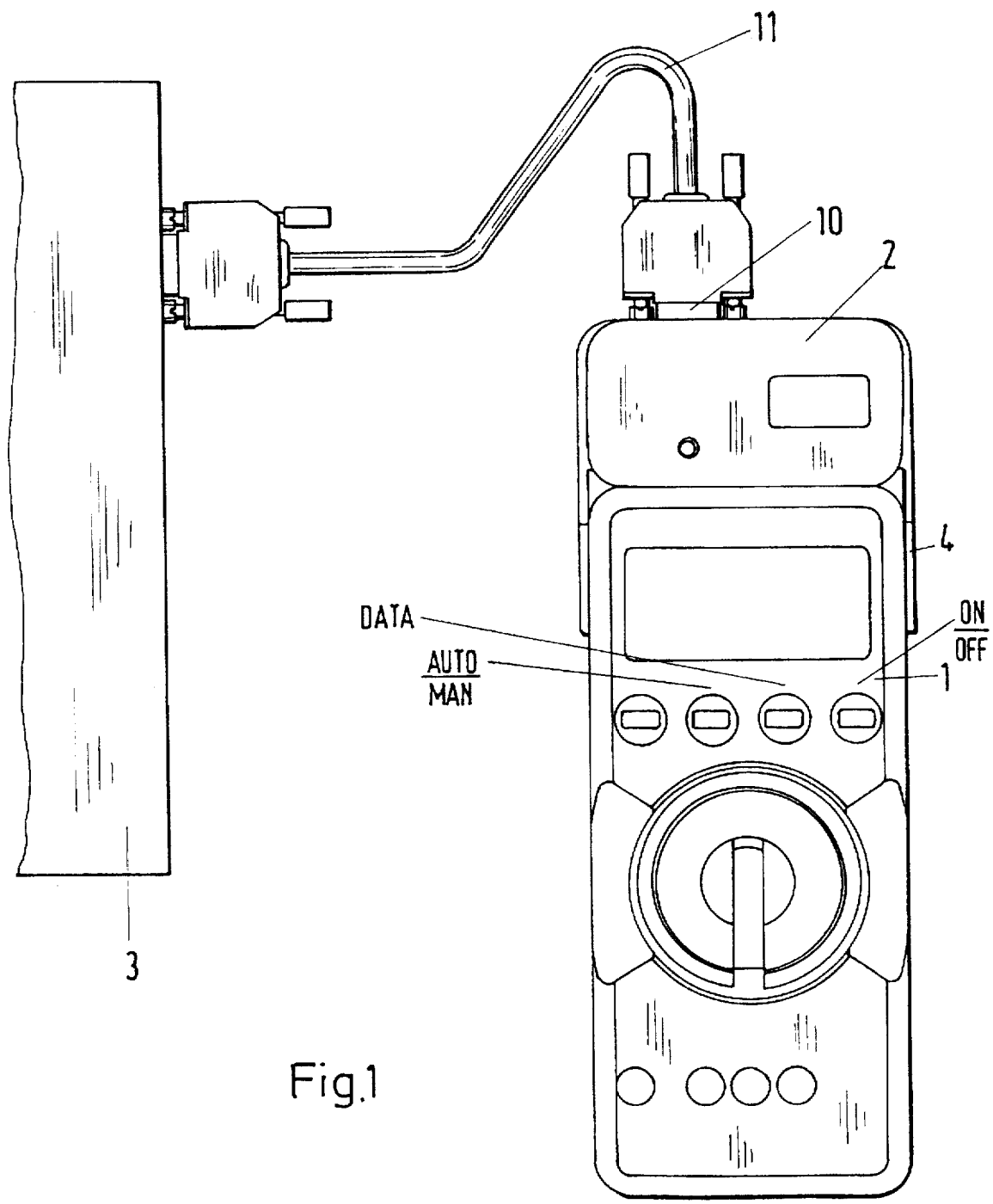
FIG. 1 is a top-plan view of the device according to the invention.
Figure 3:
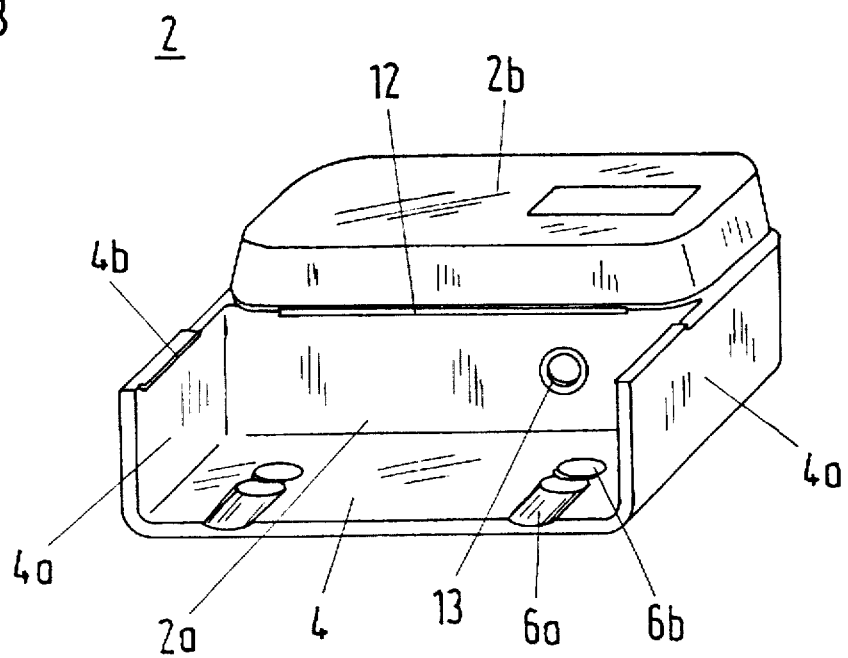
FIG. 3 is a perspective view of an auxiliary unit according to the invention.
Figure 4:
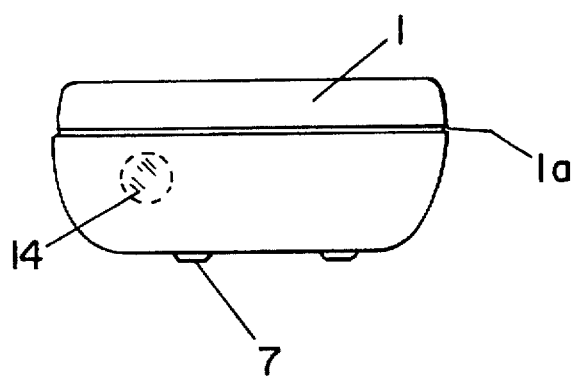
FIG. 4 is a front-elevational view of the measurement acquisition device according to the invention.

Referring now to the figures of the drawing in detail and first, particularly, to FIG. 1 thereof, there is seen a device according to the invention which includes a measurement data acquisition unit 1, shown here as a multimeter 1, an auxiliary unit 2 and a measurement data processing unit 3. The latter may be a printer, for example, or a small computer, such as a PC with an optionally connected printer. Essential for the structural configuration of the device, and at the heart of the invention, is the structure of the auxiliary unit 2, which is shown in perspective in FIG. 3.

The housing of the auxiliary unit 2 includes a shell-like lower housing part 2a and a lid-like upper housing part 2b closing the shell. Starting from a side wall of the lower housing part 2a, an adapter base 4 is formed thereon which also forms a shell. The adapter base shell 4, however, is open towards the front. The shell 4 has two side walls 4a which connect to and extend mutually opposite side walls of the lower housing part 2a. A bottom wall of the adapter base 4 and the side walls 4a together form a U, in cross-section. Inwardly pointing guide rails 4b are formed onto the two free ends of the side walls 4a, which lend the adapter base 4 a clamp and plier effect. When the multimeter 1 is inserted into the opening of the adapter base 4, the rails 4b protrude into and engage in a groove 1a provided on the multimeter 1 in a corresponding location.

In the bottom region of the inside of the adapter base 4, two slide grooves 6a in the direction of insertion are formed. After overcoming a threshold 6c, the grooves 6a terminate in a notch depression 6b. Corresponding cam-like feet or arcuate protrusions 7 are formed on the bottom of the multimeter housing. The spacing between the respective grooves 6a logically corresponds to the spacing between the cams 7. This locking effect is supported in that the guide rails 4b accurately define the position of the auxiliary unit with respect to the multimeter 1 and in that the housing material exhibits springy resiliency. Even in the case of improper handling of the two components, a breaking-away of the inserted auxiliary unit 2 from the multimeter 1 need not be feared, since a ledge or strip 12 extends into the groove 1a of the multimeter 1. The strip 12 is formed onto the upper housing part 2b, on the same height as the guide rails 4b. The groove 1a is formed by an encompassing parting line or separation seam of the multimeter 1a between its upper and lower housing parts.

Figure 2:
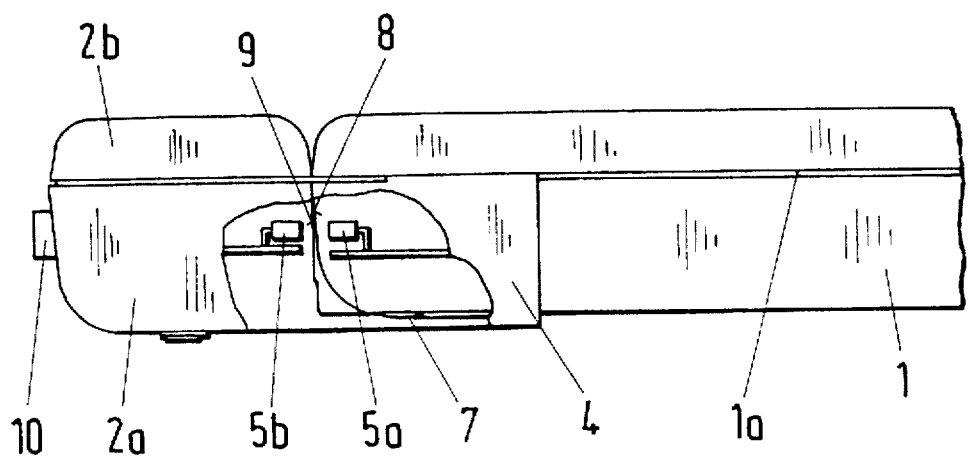
FIG. 2 is a fragmetary, partly broken-away, side-elevational view of the device.

Due to the exact positional association between the auxiliary unit 2 and the measurement data acquisition unit 1 it is assured that coupling elements 5a and 5b are disposed at a small distance from one another, which is advantageous for data transfer. As shown in FIG. 2, the coupling elements are a phototransmitter 5a, for example a light emitting diode, and a photoreceiver 5b, for example a photo diode.

In order not to unnecessarily weaken the transmission beam, an opening 13 is provided in the housing of the auxiliary unit, which is faced by a window 14 in the housing of the multimeter 1. The window 14, however, may not be visible towards the outside, and it has thus been illustrated in phantom. The window 14 may simply be defined by a recess which reduces the thickness of the housing wall at a corresponding location. Through this, the housing remains completely closed for protecting sensitive components inside the multimeter. With a corresponding choice of materials, infrared radiation especially, can easily penetrate the thin housing wall at 14.

We claim:

1. An assembly for transferring data, comprising a portable hand-held multimeter, a measurement data processing unit, and an auxiliary unit for transferring data between said multimeter and said processing unit, contact-less coupling elements operatively associated with said multimeter and said auxiliary unit respectively for transferring data between said multimeter and said auxiliary unit by contact-less coupling, and means for transferring data between said auxiliary unit and said processing unit, said auxiliary unit including a connecting member for mechanically detachably connecting said auxiliary unit with said multimeter such that said contact-less coupling elements face one another at a predetermined spacing and such that said connected multimeter and said auxiliary unit together form a portable unit, wherein said auxiliary unit includes a housing, said connecting member is in the form of an adapter base formed onto said housing, guide and notch elements formed in said adapter base, and wherein said multimeter includes deformations in a surface thereof proportionally corresponding to said guide and notch elements for retaining said multimeter in said adapter base, wherein said coupling elements are opto-electric coupling elements said opto-electric coupling elements operate in an infrared wavelength range and include at least one phototransmitter and at least one photoreceiver, one of said phototransmitter and photoreceiver being associated with said multimeter and said other one with said auxiliary unit, wherein said contact-less coupling elements allow for bidirectional data flow between said multimeter and said auxiliary unit, and wherein said multimeter has a multimeter housing with a contour and a groove formed therein extending parallel to a bottom of said housing, and said adapter base including said walls and a bottom wall forming a clamp-like U-shell, said adapter base further including mutually facing guide rails formed onto free ends of said side walls for slidably engaging in said groove formed in said multimeter housing, and wherein said multimeter housing is formed of infrared translucent material for enabling optical transmission between said coupling elements through a wall of said multimeter housing.

2. The assembly according to claim 1, wherein said measurement data processing unit is a printer.

3. The assembly according to claim 1, wherein said measurement data processing unit is a computer.

4. The assembly according to claim 1, wherein said deformations on said multimeter are in the form of indentations and protrusions for engaging in said guide and notch elements of said auxiliary unit, such that an operating surface of said multimeter remains freely accessible when said auxiliary unit and said multimeter are connected.

5. The assembly according to claim 4, wherein said multimeter unit has a lateral end surface, said housing of said auxiliary unit connecting adjacent said lateral end surface.

6. The assembly according to claim 1, wherein said multimeter housing has a bottom and said deformations are cam-like feet integrally formed on said bottom, and wherein said guide and notch elements are indentations in the form of glide grooves and notch troughs formed in said adapter base for receiving said cam-like feet and for mechanically retaining said multimeter and said auxiliary unit in a locked position.

7. The assembly according to claim 1, wherein said auxiliary unit includes a housing, said housing being formed of upper and lower shell-shaped housing parts, said connecting member being in the form of an adapter base integrally formed on said lower housing part for allowing said multimeter to be slidably inserted in said auxiliary unit such that a side wall of said multimeter located forward in a direction of insertion is positioned immediately adjacent and parallel to a side wall of said housing of said auxiliary unit.

8. The assembly according to claim 1, wherein said multimeter and said auxiliary unit each includes a housing with respective side walls which, upon connection of said units, abut one another, and wherein said coupling elements are respectively disposed immediately behind said abutting side walls.

9. The assembly according to claim 1, including a ledge formed on said upper housing part of said auxiliary unit for engaging into said groove of said multimeter when said multimeter and said auxiliary unit are connected.

10. The assembly according to claim 9, wherein said housing of said multimeter is formed of upper and lower housing parts and said groove for engagement with said guide rails and said ledge is defined by a parting line between said housing parts.

11. The assembly according to claim 1, including connecting means for electrically connecting said auxiliary unit to said processing unit.

* * * * *